(12) United States Patent
Park et al.

(10) Patent No.: US 11,450,704 B2
(45) Date of Patent: Sep. 20, 2022

(54) IMAGE SENSOR AND METHOD OF MANUFACTURING SAME

(71) Applicant: SAMSUNG ELECTRONICS CO., LTD., Suwon-si (KR)

(72) Inventors: Sangsu Park, Seoul (KR); Kwansik Kim, Seoul (KR); Sangchun Park, Seoul (KR); Beomsuk Lee, Seoul (KR); Taeyon Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 225 days.

(21) Appl. No.: 16/878,303

(22) Filed: May 19, 2020

(65) Prior Publication Data

US 2021/0136330 A1 May 6, 2021

(30) Foreign Application Priority Data

Nov. 1, 2019 (KR) .................. 10-2019-0138988

(51) Int. Cl.
*H01L 27/146* (2006.01)
*H04N 9/04* (2006.01)
*H04N 5/357* (2011.01)
*H01L 51/42* (2006.01)
*H01L 31/032* (2006.01)

(52) U.S. Cl.
CPC .... *H01L 27/14643* (2013.01); *H01L 27/1463* (2013.01); *H01L 27/14609* (2013.01); *H01L 27/14625* (2013.01); *H01L 27/14638* (2013.01); *H01L 27/14665* (2013.01); *H01L 51/428* (2013.01); *H04N 5/3577* (2013.01); *H04N 9/04551* (2018.08); *H01L 27/1464* (2013.01); *H01L 27/14621* (2013.01); *H01L 31/0323* (2013.01); *H04N 5/3575* (2013.01)

(58) Field of Classification Search
CPC ........... H01L 27/14643; H01L 27/1464; H01L 27/14625; H01L 51/428; H01L 31/0232
See application file for complete search history.

(56) References Cited

U.S. PATENT DOCUMENTS

| 8,368,784 B2 | 2/2013 | Yamaguchi |
| 8,953,073 B2 | 2/2015 | Sul et al. |
| 9,343,492 B2 | 5/2016 | Jin et al. |

(Continued)

OTHER PUBLICATIONS

Search Report Issued by the European Patent Office Corresponding to Application No. EP20204956..5 dated Mar. 23, 2021.

*Primary Examiner* — David A Zarneke
(74) *Attorney, Agent, or Firm* — Volentine, Whitt & Francos, PLLC

(57) ABSTRACT

An image sensor includes pixel regions separated by an isolation region and receiving incident light, color filters respectively disposed on a surface of the semiconductor substrate corresponding to the pixel regions, a cover insulating layer disposed on the surface of the semiconductor substrate and covering the color filters, first transparent electrodes disposed on the cover insulating layer and spaced apart to respectively overlap the color filters, an isolation pattern disposed on the cover insulating layer between the first transparent electrodes and having a trench spaced apart from the first transparent electrodes, a drain electrode disposed in the trench of the isolation pattern, and an organic photoelectric layer and a second transparent electrode sequentially disposed on the first transparent electrodes and the isolation pattern.

13 Claims, 18 Drawing Sheets

(56) References Cited

U.S. PATENT DOCUMENTS

| | | |
|---|---|---|
| 9,761,636 B2 | 9/2017 | Lee et al. |
| 9,882,154 B2 | 1/2018 | Yamaguchi |
| 10,050,070 B2 | 8/2018 | Otake et al. |
| 10,204,964 B1 | 2/2019 | Lee et al. |
| 2004/0065902 A1 | 4/2004 | Yamazaki et al. |
| 2005/0206590 A1 | 9/2005 | Sasaki et al. |
| 2019/0131340 A1 | 5/2019 | Kim et al. |

# IMAGE SENSOR AND METHOD OF MANUFACTURING SAME

CROSS-REFERENCE TO RELATED APPLICATIONS

This application claims priority to Korean Patent Application No. 10-2019-0138988 filed on Nov. 1, 2019 in the Korean Intellectual Property Office, the subject matter of which is hereby incorporated by reference.

BACKGROUND

1. Field

The inventive concept relates generally to image sensors, and more particularly, to image sensors having an organic photoelectric layer. The inventive concept also relates to methods of manufacturing images sensors having an organic photoelectric layer.

2. Description of Related Art

An image sensor may be used to capture electromagnetic energy (e.g., visible light) associated with an image, and convert the electromagnetic energy into a corresponding electrical signal. Image sensors are widely used in portable electronic devices like smart phones, camcorders and cameras, as well as automobiles, security devices, home electronics, and robots.

The design and manufacture of images sensors is driven by a number of factors including reducing physical size and increasing image resolution. Various studies have been conducted examining image sensor miniaturization and resulting image resolution for the image sensor. In this regard, image sensors having an organic photoelectric layer has been examined Image sensors having an organic photoelectric layer allow reduction in overall pixel size, but may suffer from resolution issues caused by electrical noise.

SUMMARY

In one aspect, the inventive concept provides an image sensor having an organic photoelectric layer exhibiting reduced crosstalk between pixels. In another aspect, the inventive concept provides a method of manufacturing this type of image sensor.

In one aspect, the inventive concept provides an image sensor including; a semiconductor substrate including a plurality of pixel regions separated by an isolation region and having a first surface and an opposing second surface, wherein the second surface receives incident light, a plurality of color filters respectively disposed on the second surface of the semiconductor substrate to correspond to the plurality of pixel regions, a cover insulating layer disposed on the second surface of the semiconductor substrate and covering the plurality of color filters, a plurality of first transparent electrodes disposed on the cover insulating layer and spaced apart to respectively overlap the plurality of color filters, an isolation pattern disposed on the cover insulating layer between the plurality of first transparent electrodes and having a trench spaced apart from the plurality of first transparent electrodes, a drain electrode disposed in the trench of the isolation pattern, and an organic photoelectric layer and a second transparent electrode sequentially disposed on the plurality of first transparent electrodes and the isolation pattern.

In another aspect, the inventive concept provides an image sensor including; a semiconductor substrate including a plurality of pixel regions, a wiring structure disposed on the semiconductor substrate and having a wiring circuit, a plurality of first transparent electrodes respectively disposed on the wiring structure to correspond to the plurality of pixel regions, an isolation pattern disposed between the plurality of first transparent electrodes on the wiring structure and having a trench spaced apart from the plurality of first transparent electrodes, a drain electrode disposed in the trench of the isolation pattern, and an organic photoelectric layer and a second transparent electrode sequentially disposed on the plurality of first transparent electrodes and the isolation pattern.

In another aspect, the inventive concept provides an image sensor including; a semiconductor substrate including a plurality of pixel regions, a plurality of first transparent electrodes respectively disposed on the semiconductor substrate to correspond to the plurality of pixel regions, and including a lower electrode layer and an upper electrode layer, which are sequentially stacked, a first isolation pattern disposed on the semiconductor substrate between the lower electrode layer of the plurality of first transparent electrodes, and having a first trench spaced apart from the plurality of first transparent electrodes, a first electrode line disposed in the first trench of the first isolation pattern, a second isolation pattern disposed on the first isolation pattern between the upper electrode layer of the plurality of first transparent electrodes, and having a second trench spaced apart from the plurality of first transparent electrodes, a second electrode line disposed in the second trench and separated from the first electrode line by the second isolation pattern, and an organic photoelectric layer and a second transparent electrode sequentially disposed on the plurality of first transparent electrodes and the second isolation pattern.

BRIEF DESCRIPTION OF DRAWINGS

The above and other aspects, features, and advantages of the inventive concept will be more clearly understood from the following detailed description, taken in conjunction with the accompanying drawings, in which.

DETAILED DESCRIPTION

Hereinafter, certain example embodiments of the inventive concept will be described in some additional detail with reference to the accompanying drawings.

Figure 1:
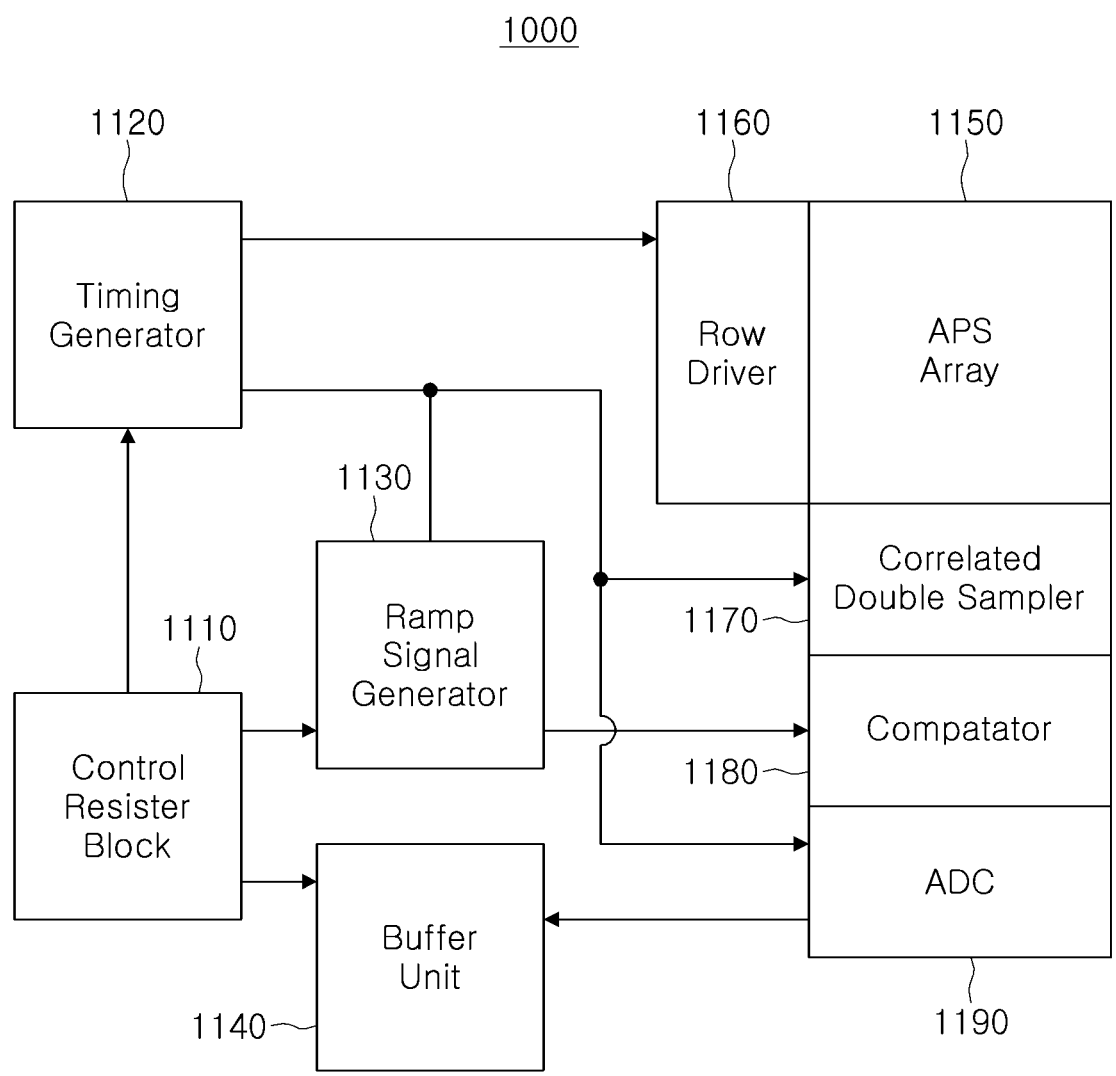
FIG. 1 is a block diagram illustrating an image sensor according to an example embodiment of the inventive concept.

FIG. 1 is a block diagram illustrating an image sensor according to an example embodiment of the inventive concept.

Referring to FIG. 1, an image sensor 1000 may include a control register block 1110, a timing generator 1120, a ramp generator 1130, a buffer unit 1140, an active pixel sensor (APS) array 1150, a row driver 1160, a correlated double sampler 1170, a comparator 1180, and an analog-to-digital converter 1190.

The control register block 1110 may control the overall operation of the image sensor 1000. For example, the control register block 1110 may transmit an operation signal to the timing generator 1120, the ramp generator 1130, and the buffer unit 1140.

The timing generator 1120 may generate one or more reference signal(s) (e.g., clock(s)) that may be used to regulate the operational timing of various components of the image sensor 1000. For example, one or more reference signal(s) may be generated by the timing generator 1120 and transmitted to the row driver 1160, the correlated double sampler 1170, the comparator 180, and/or the analog-to-digital converter 1190.

The ramp generator 1130 may be used to generate and/or transmit (hereafter, "generate/transmit") a ramp signal used by the correlated double sampler 1170 and/or the comparator 1180. In addition, the buffer unit 1140 may include a latch unit. The buffer unit 1140 may be used to temporarily store an image signal to be provided to an external device and/or image data received from the external device.

The APS array 1150 may be used to sense electromagnetic energy associated with an image (hereafter, "sense an image"). In this regard, the electromagnetic energy may be sensed over one or more defined bands, such as a visual light band, an infrared band, etc. The APS array 1150 may include a plurality of active pixels. The row driver 1160 may selectively activate a row of the ARS array 1150. The correlated double sampler 1170 may sample and output an analog signal generated from the ARS array 1150.

The comparator 1180 may generate various reference signals by comparing a slope of a ramp signal fed back according to data transmitted from the correlated double sampler 1170 in relation to (e.g.,) an analog reference voltage. The analog-digital converter 1190 may convert analog image data into corresponding digital image data.

Figure 2:
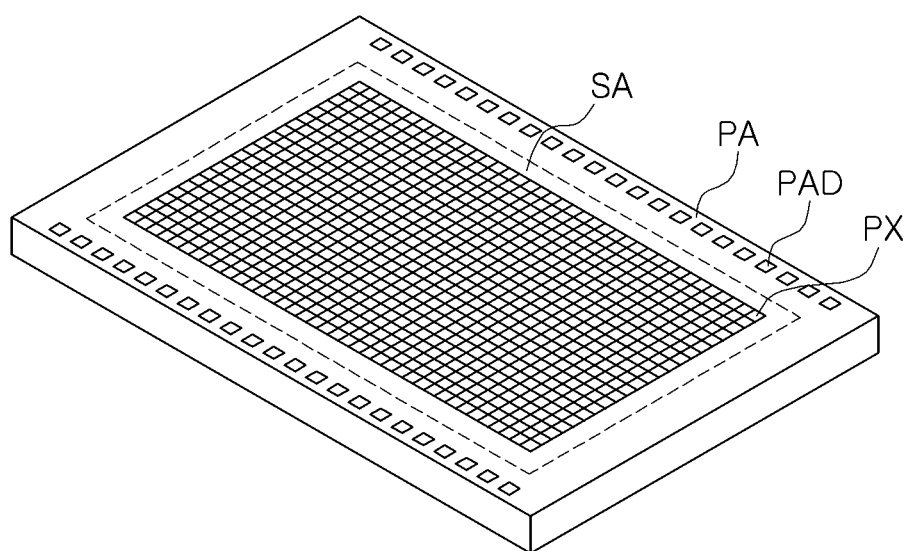
FIG. 2 is a perspective view of an image sensor according to an example embodiment of the inventive concept.

FIG. 2 is a perspective view of the image sensor 1000 of FIG. 1 according to an example embodiment of the inventive concept.

Referring to FIG. 2, the image sensor 1000 may include a pixel array region SA and a peripheral region PA disposed in one or more peripheral region(s) proximate to the pixel array region SA.

The pixel array region SA may include the APS array 1150 of FIG. 1. The pixel array region SA may include a plurality of pixel regions PR arranged in a matrix (e.g., an arrangement of rows and columns) Each pixel region PR may include one or more photoelectric converting elements, such photodiode(s) and/or transistor(s).

The peripheral region PA may include pad regions PAD. The pad regions PAD may be configured to transmit and/or receive (hereafter, "transmit/receive") one or more electrical signal(s) to/from an external device.

In some example embodiments, the pad regions PAD may be used to provide driving power (e.g., a power supply voltage or a ground voltage) which may be externally supplied to the image sensor 1000. In this regard, a power supply voltage provided by at least one pad of the pad regions PAD may be applied to a drain electrode (e.g., element 270D of FIG. 3) through a wiring structure and/or through vias. (See, hereafter, FIG. 3).

The image sensor 1000 of FIGS. 1 and 2 may include a single semiconductor package including a single image sensor chip. Alternately, the image sensor 1000 of FIGS. 1 and 2 may include a stacked semiconductor package including a plurality of chips (e.g., a logic chip, one or more memory chip(s), and at least one image sensor chip(s)).

Figure 3:
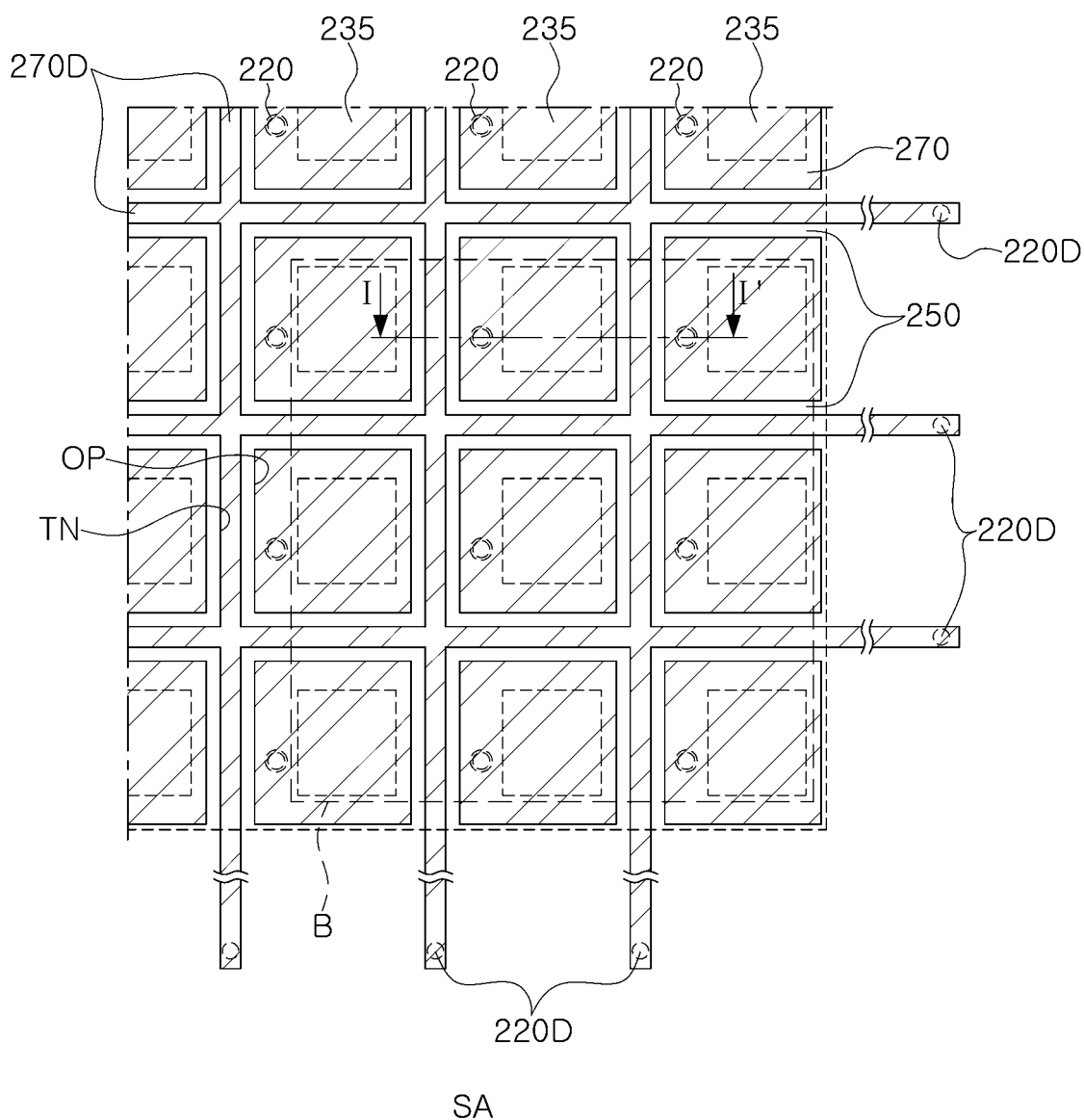
FIG. 3 is a plan view illustrating an image sensor according to an example embodiment of the inventive concept.
Figure 4:
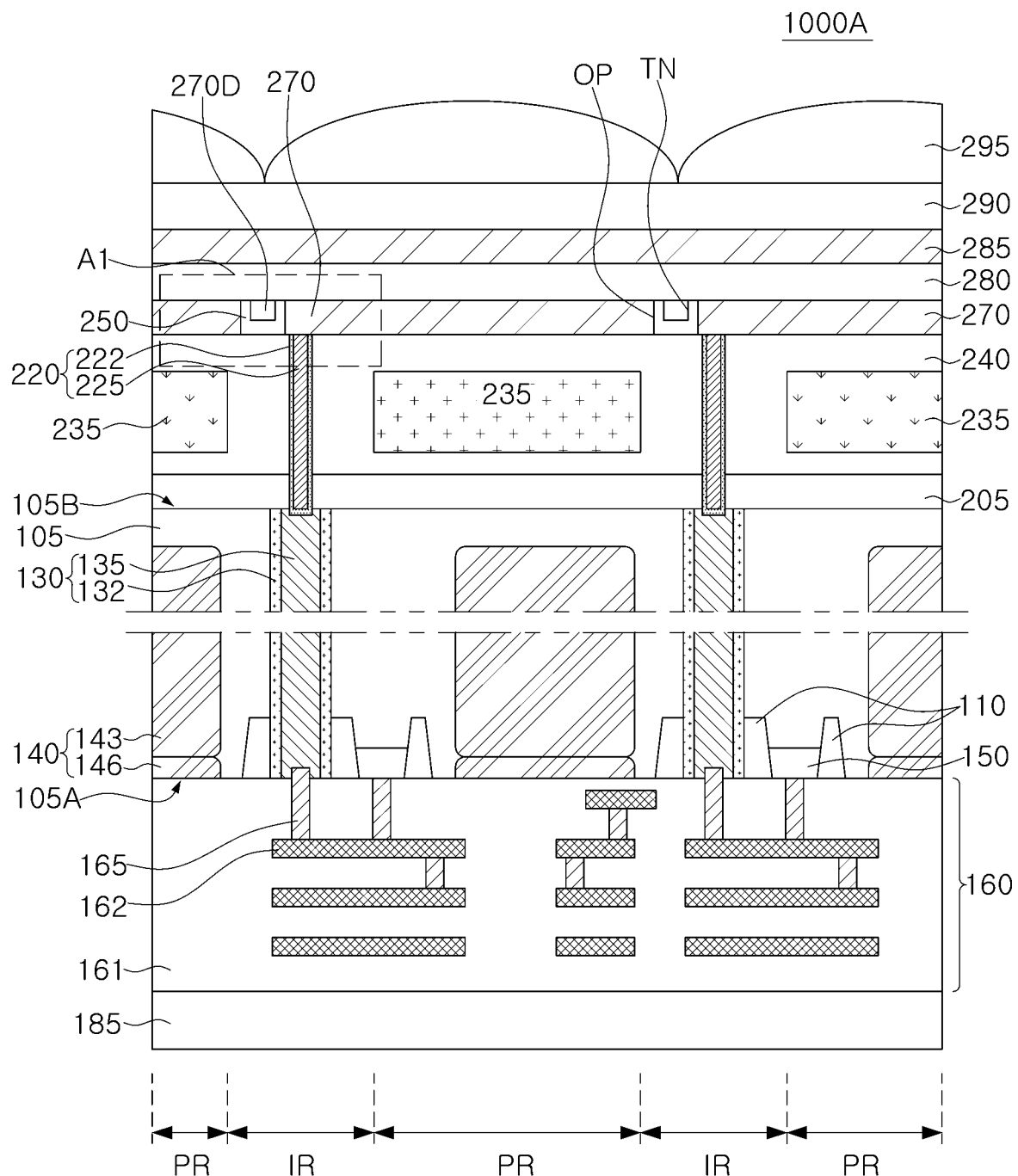
FIG. 4 is a cross-sectional view taken along line I-I' of the image sensor of FIG. 3.

FIG. 3 is a plan view further illustrating in one example (1000A) an image sensor according to an example embodiment of the inventive concept. FIG. 4 is a cross-sectional view taken along line I-I' of FIG. 3. Here, the plan view of FIG. 3 further illustrates an upper surface of a first transparent electrode 270 and an isolation pattern 250 in which an organic photoelectric layer 280 and an upper structure thereof are omitted.

Referring collectively to FIGS. 3 and 4, an image sensor 1000A may include a semiconductor substrate 105 having a first surface 105A and an opposing second surface 105B in which photodiodes 140 are implemented. The photodiodes 140 may be respectively disposed in a plurality of pixel regions PR separated by an isolation region IR. The photodiodes 140 may serve to convert electromagnetic energy (hereafter, e.g., "incident light") received through the second surface 105B into a corresponding electrical signal. Here, the photodiodes 140 may also be referred to as semiconductor photoelectric converting elements, such as silicon photoelectric converting elements.

Each of the photodiodes 140 may include a first impurity region 143 and a second impurity region 146 having different conductivity types. For example, the second impurity region 146 may have a P-type conductivity, and the first impurity region 143 may have an N-type conductivity in a region adjacent to at least the second impurity region 146. The first impurity region 143 may be formed deeper from the first surface 105A of the semiconductor substrate 105 than the second impurity region 146. As a result, a P-N junction formed between the first and second impurity regions 143 and 146 may be disposed closer to the first surface 105A than the second surface 105B of the semiconductor substrate 105.

Storage node regions 150 spaced apart from the photodiodes 140 by an element isolation region 110 may be disposed in the semiconductor substrate 105. The storage node regions 105 may have a different conductivity type than the semiconductor substrate 105. For example, the semiconductor substrate 105 may have a P-type conductivity, and the storage node regions 150 may have an N-type conductivity.

A wiring structure 160 may be disposed on the first surface 105A of the semiconductor substrate 105. The wiring structure 160 may include an insulating structure 161 disposed on the first surface 105A of the semiconductor substrate 105 and a wiring circuit disposed in the insulating structure 161 and having a metal wiring 162 and a metal via 165.

A support layer 185 may be disposed on the wiring structure 160. When included, the support layer 185 provides additional mechanical strength to the semiconductor substrate 105. The support layer 185 may be formed from silicon oxide, silicon nitride, and/or an additional semiconductor material.

First through vias 130 may be provided that penetrate through the semiconductor substrate 105. That is, the first through vias 130 may be formed between the first surface 105A and the second surface 105B of the semiconductor substrate 105. In some example embodiments, the first through vias 130 may be disposed in the element isolation region 110 adjacent to the first surface 105A of the semiconductor substrate 105. The first through vias 130 may include a via plug 135 and an insulating barrier 132 surrounding the via plug 135. The via plug 135 may be formed from one or more conductive material(s), such as copper (Cu), aluminum (Al), titanium (Ti), titanium nitride (TiN), tungsten (W), and/or a conductive metal nitride or polysilicon. The insulating barrier 132 may be formed from an insulating material, such as a silicon oxide and/or a silicon nitride.

An antireflection film 205 may be disposed on the second surface 105B of the semiconductor substrate 105. The antireflection film 205 may suppress extraneous or reflected electromagnetic energy (e.g., reflected incident light) on the second surface 105B of the semiconductor substrate 105. The use of the antireflection film 201 improves the quality of the incident light illuminating the semiconductor substrate 105 and facilitates operation of the photodiodes 140. The antireflection film 205 may be formed from, e.g., SiON, SiC, SiCN, and SiCO.

A cover insulating layer 240 may be disposed on the antireflection film 205, and a plurality of color filters 235 may be embedded in the cover insulating layer 240 in regions respectively corresponding to the plurality of pixel regions PR. Each of the plurality of color filters 235 may be disposed to overlap (or overlay) the photodiodes 140, respectively, and the plurality of color filters 235 may be covered by the cover insulating layer 240 disposed on the second surface 105B of the semiconductor substrate 101. The cover insulating layer 240 may include, for example, an oxide film, a nitride film, a low dielectric film, a resin layer, or a combination thereof. In some example embodiments, the cover insulating layer 240 may have a multilayer structure, and/or may have a substantially flat upper surface.

The color filters 235 may include (e.g.,) red and blue color filters. Here, for example, a red color filter may selectively pass certain electromagnetic wavelengths associated with visually red light to the photodiodes 140 overlapping the red color filter. In the illustrated example of FIGS. 3 and 4, the organic photoelectric layer 280 may be configured to absorb green light. A more detailed description of the organic photoelectric layer 280 will be provided hereafter.

Second through vias 220 may be provided that continuously penetrate through the cover insulating layer 240 and the antireflection film 205. Respective second through vias 220 may contact respective first through vias 130 to provide a vertical connection path (hereafter, the "first through electrode structure") variously connecting the circuit wirings 162 and 165 of the wiring structure 160. The second through vias 220 may include a via plug 225 and a conductive barrier 222 covering a side surface (and possibly also a bottom surface) of the via plug 225. Here, the via plug 225 may be formed from one or more metal(s), such as copper (Cu), aluminum (Al), titanium (Ti), and/or tungsten, and the conductive barrier 222 may be formed from a conductive metal nitride, such as titanium nitride (TiN).

Referring to FIGS. 3 and 4, an isolation pattern 250 having openings OP may be disposed on the cover insulating layer 240. The openings OP may respectively overlap one of the color filters 235. The openings OP may be formed to open a region corresponding to the plurality of pixel regions PR of an upper surface of the cover insulating layer 240.

In the example embodiment illustrated in FIGS. 3 and 4, the openings OP may open a portion of the upper surface of the cover insulating layer 240. The second through vias 220 may be positioned in upper surface regions by the openings OP.

A plurality of first transparent electrodes 270 may be disposed in relation to the plurality of openings OP. The plurality of first transparent electrodes 270 may be disposed on the cover insulating layer 240 to have regions overlapping the plurality of color filters 235, respectively. The plurality of first transparent electrodes 270 may be connected to the second through vias 220, respectively. As described above, the second through vias 220 may be connected to the first through vias 130, respectively, to provide first through electrode structures 130 and 220 extending to the wiring structure 160. The first through electrode structures 130 and 220 may penetrate the isolation region IR, and electrically connect the plurality of first transparent electrodes 270 and the plurality of pixel regions PR, respectively, through the wiring circuits 162 and 165.

As illustrated in FIG. 3, the isolation pattern 250 may have a lattice form extending along a space between the plurality of first transparent electrodes 270. The isolation pattern 250 may have a trench TN in a position spaced apart from the plurality of first transparent electrodes 270. A drain electrode 270D may be disposed in the trench TN. One end of the drain electrode 270D may be connected to a second through electrode structure 220D formed of first and second through vias, similar to the first through electrode structures 130 and 220 connected to the first transparent electrode 270. The second through electrodes structure 220D may penetrate the isolation region IR to electrically connect the wiring circuits 162 and 165. The isolation region may be positioned in the peripheral region PA (of FIG. 2) surrounding the plurality of pixel regions, and the second through electrode structure 220D may be disposed in the peripheral region PA.

Figure 5:
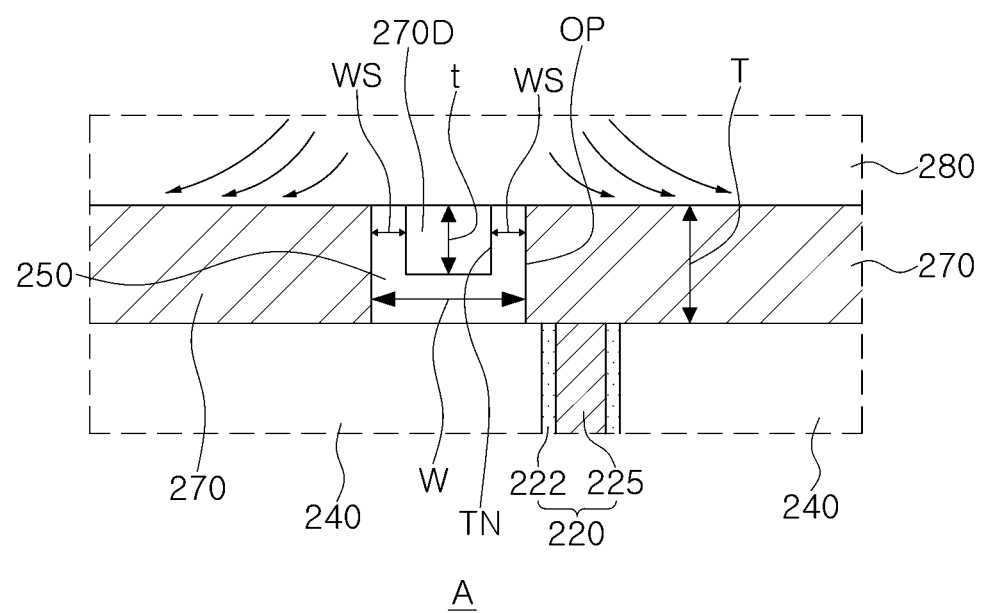
FIG. 5 is an enlarged view illustrating portion "A1" of the image sensor of FIG. 4.

Referring to FIG. 5, a thickness (t) of the drain electrode 270D may be less than the respective thicknesses (T) of the plurality of first transparent electrodes 270. Respective thicknesses (T) of the plurality of first transparent electrodes 270 may be substantially the same as the thickness of the isolation pattern 250. As such, while openings OP in which a second transparent electrode 270 may be disposed penetrate the isolation pattern 250, the trench TN may have a groove structure that does not completely penetrate the isolation pattern 250. For example, a thickness of a bottom portion of the trench TN in the isolation pattern 250 may be 5% or more of the thickness (T) of the isolation pattern 250.

The isolation pattern 250 may include an insulating material. For example, the isolation pattern 250 may be formed from a silicon oxide, a silicon nitride, and/or a silicon oxynitride. The plurality of first transparent electrodes 270 and the drain electrode 270D may include an electrode material and may be formed from the same transparent electrode material. For example, the transparent electrode material may include ITO, IZO, ZnO, $SnO_2$, antimony-doped tin oxide (ATO), Al-doped zinc oxide (AZO), gallium-doped zinc oxide (GZO), and/or fluorine-doped tin oxide (FTO). The plurality of first transparent electrodes 270 and the drain electrode 270D may be formed using a damascene process that uses an isolation pattern 250 having a trench TN and openings OP. See, e.g., FIG. 6C, hereafter. The respective upper surfaces of the plurality of first transparent electrodes 2670 may be substantially coplanar with the upper surfaces of the isolation pattern 250 and the drain electrode 270D.

The isolation pattern 250 having the trench TN and the openings OP may be formed using a double-patterning technology (DPT). (Example of the DPT will be described hereafter with reference to FIGS. 7A to 7E, and FIGS. 8A to 8E). For example, a width (W) of the isolation pattern 250 may be 100 nm or less. Sidewall portions positioned on both sides of the drain electrode 270D in the isolation pattern 250 may have substantially the same width 'WS'. For example, each sidewall portion width WS of the isolation pattern may be in a range of between about 5 nm to about 30 nm. For example, a width of the drain electrode may be in a range of between about 10 nm to about 90 nm. However, the inventive concept is not limited thereto, and may be changed according to process conditions such as a photolithography facility, or the like.

An organic photoelectric layer 280 may be disposed on the first transparent electrodes 270 and the isolation pattern 250. The organic photoelectric layer 280 may be formed to cover the first transparent electrodes 270 and the isolation pattern 250. The organic photoelectric layer 280 may be integrally formed over the plurality of pixel regions PR. The organic photoelectric layer 280 may contact upper surfaces of the first transparent electrodes 270 and the isolation pattern 250. The organic photoelectric layer 280 may include an organic material that causes photoelectric change only in light of a specific wavelength (e.g., green light).

The organic photoelectric layer 280 may include a single layer or a multilayer structure in which a P-type semiconductor material and an N-type semiconductor material form P/N flat junction or bulk heterojunction. The organic photoelectric layer 280 may be a layer that isolates excitons generated in response to incident light. For example, the P-type semiconductor material and the N-type semiconductor material in the organic photoelectric layer 280 may absorb incident light wavelengths associated with green light, respectively, and may have a maximum absorption peak in a peak region of about 500 nm to 600 nm, respectively. The organic photoelectric layer 280 may have a thickness ranging between about 1 nm to 500 nm.

A second transparent electrode 285 may be disposed on the organic photoelectric layer 280. For example, the second transparent electrode 285 may include ITO, IZO, ZnO, $SnO_2$, ATO, AZO, GZO, or FTO, similarly to the first transparent electrodes 280.

In relation to FIG. 5, when a potential higher than a potential of the first transparent electrode 270 is applied to the drain electrode 270D positioned below the organic photoelectric layer 280, holes (or electrons) do not exhibit crosstalk (thereby reducing noise) in a region of the organic photoelectric layer 280 positioned above the drain electrode 270D, and may move to adjacent first transparent electrodes 270D on both sides as indicated by arrows and quantum efficiency may be increased. In relation to FIG. 3, the drain electrode 270D may be connected to the wiring circuits 162 and 165 through the second through structure 220D, and a drain voltage from an outside (e.g., a pad PD of FIG. 1) may be applied to a drain electrode through the wiring circuit and the second through structure 220D.

A protective insulating layer 290 may be disposed on the second transparent electrode 285. For example, the protective insulating layer 290 may include an insulating material, such as a silicon oxide and/or a silicon oxynitride. Micro-lenses 295 may be disposed on the protective insulating layer 290. The micro-lenses 295 may overlap the color filters 235. The micro-lenses 295 may focus (or condense) light into the photodiodes 140 by selectively changing the path of incident light.

Figure 6A:
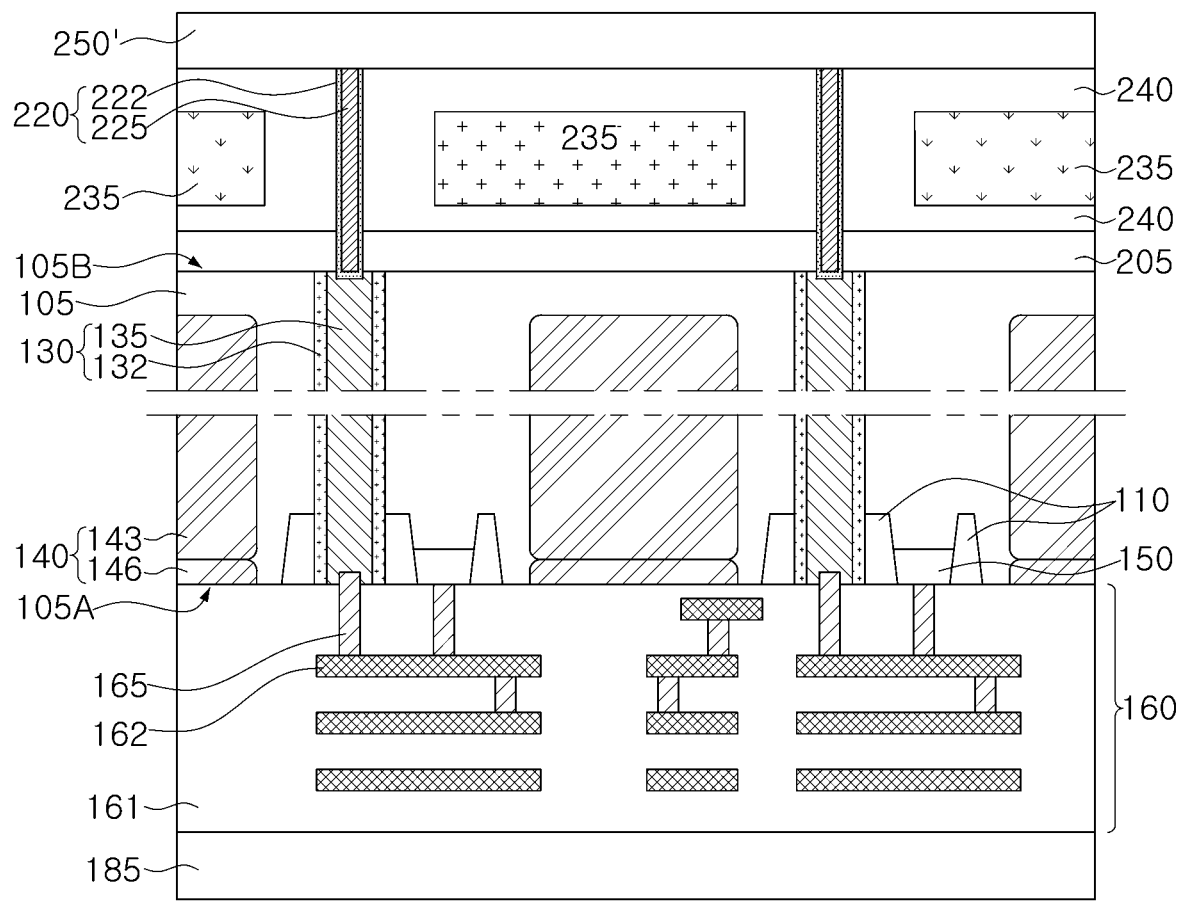
FIGS. 6A, 6B and 6C are cross-sectional views of processes illustrating a method of manufacturing an image sensor according to an example embodiment of the inventive concept.
Figure 6B:
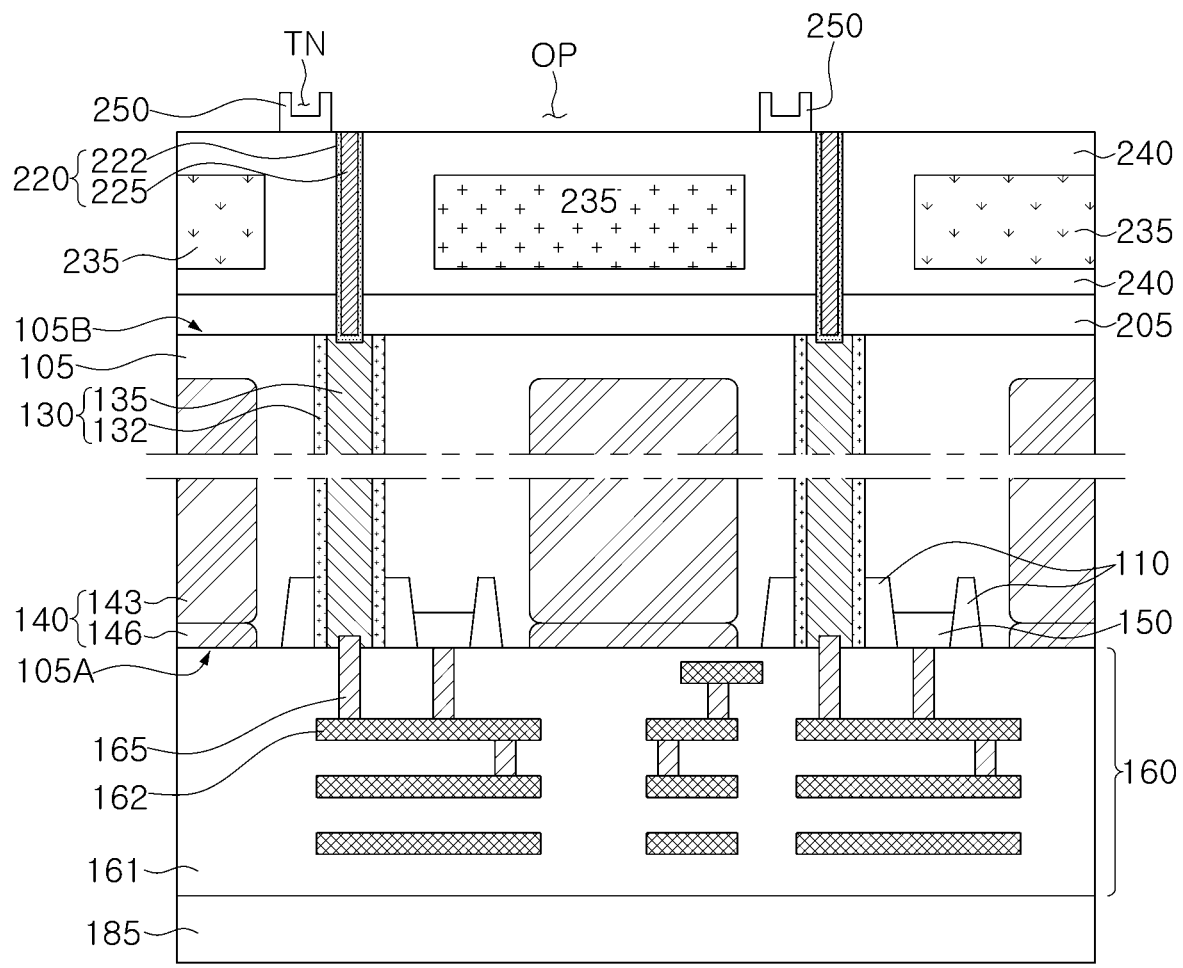
Figure 6C:
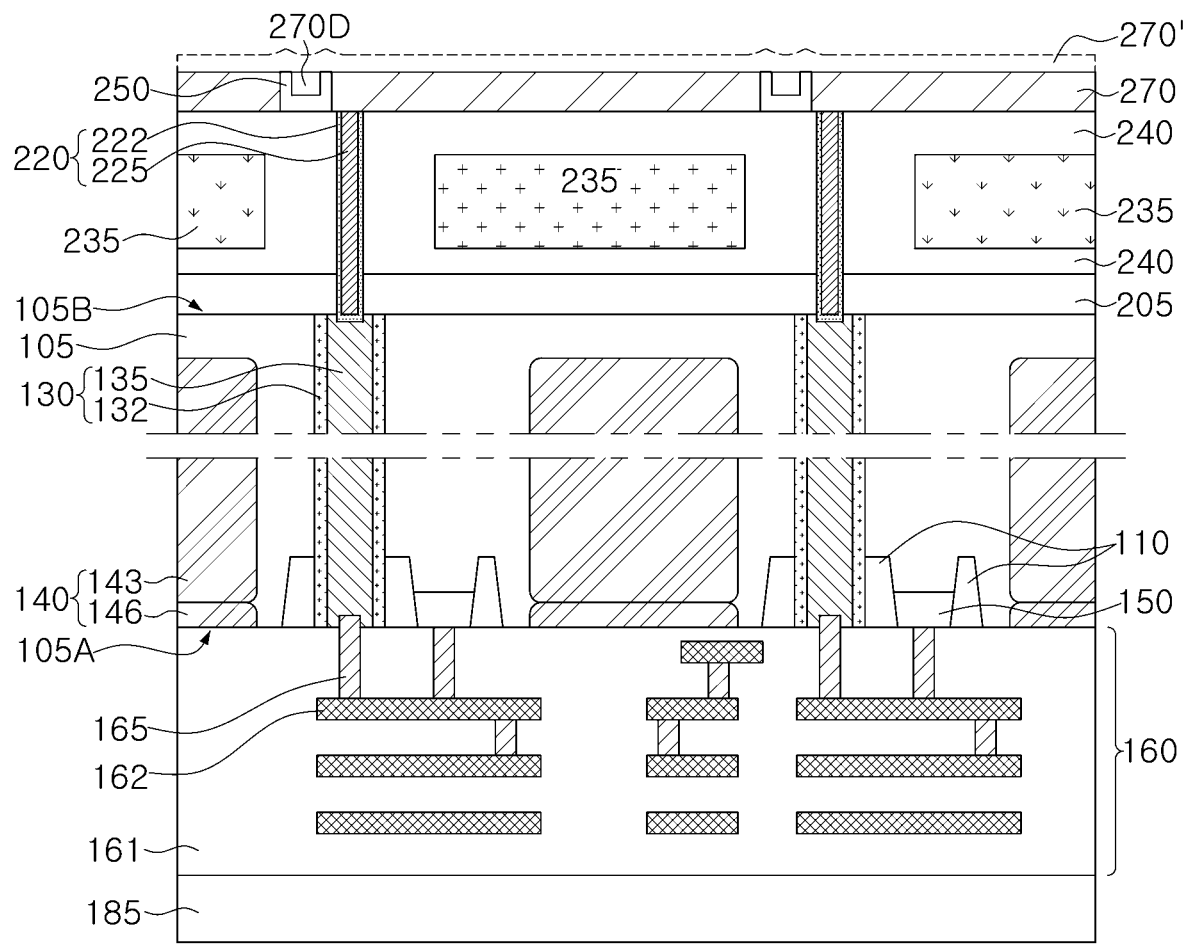

FIGS. 6A, 6B and 6C are related cross-sectional views further illustrating processes that may be used to form an isolation pattern, a first transparent electrode and a drain electrode in a method of manufacturing an image sensor according to an example embodiment of the inventive concept.

Referring to FIG. 6A, an insulating layer 250' for an isolation pattern may be formed on the cover insulating layer 240. Here, the isolation pattern 250 may include a silicon oxide, a silicon nitride, and/or a silicon oxynitride. The thickness of the insulating layer 250' may be defined in consideration of the thickness of the first transparent electrode.

Referring to FIG. 6B, an isolation pattern 250 having openings OP and a trench TN may be formed from the insulating layer 250'.

The openings OP and the trench TN of the isolation pattern 250 are provided as a space for forming a first transparent electrode and a drain electrode, respectively. The isolation pattern 250 may also be referred to as a mold structure for the first transparent electrode and the drain electrode. Here, it should be noted that certain embodiments of the inventive concept provide a method of forming an isolation pattern (e.g., isolation pattern 250) having an opening (e.g., opening OP) with a relatively smaller width using a double patterning technique DPT. In this regard, a method of forming the isolation pattern 250 as a mold structure for the first transparent electrode and the drain electrode will be described in some additional detail with reference to FIGS. 7A to 7E, and FIGS. 8A and 8E.

FIGS. 7A, 7B, 7C, 7D and 7E ("FIGS. 7A to 7E", inclusive) are perspective views illustrating processes that may be used to form the isolation pattern 250 of FIG. 6B. FIGS. 7A to 7E further illustrate an isolation pattern portion positioned in a "B" region in the pixel array region SA of FIG. 3.

FIGS. 8A, 8B, 8C, 8D and 8E ("FIGS. 8A to 8E", inclusive) are cross-sectional views further illustrating the pixel array region SA taken along line II-II' and the peripheral region PA in FIGS. 7A to 7E.

Figure 7A:
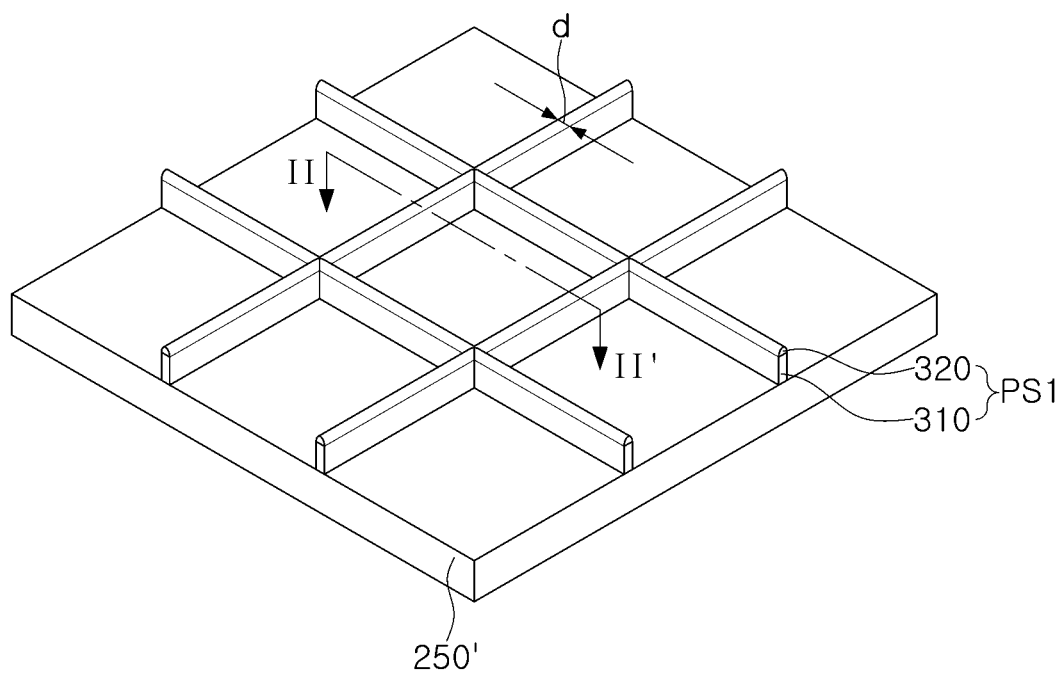
FIGS. 7A to 7E are perspective views of processes illustrating a process of forming the isolation pattern of FIG. 6B.
Figure 8A:
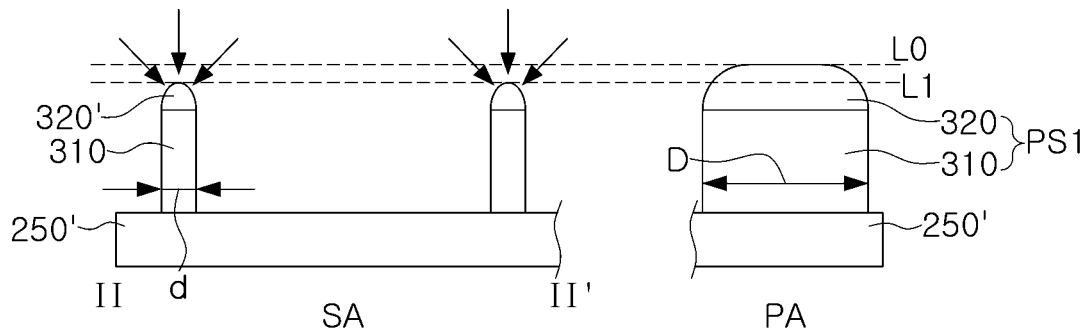
FIGS. 8A to 8E are cross-sectional views of processes illustrating a process of forming the isolation pattern of FIG. 6B.

Referring collectively to FIGS. 7A and 8A, a sacrificial layer 310 is formed on the insulating layer 250' for the isolation pattern, and a first pattern structure PS1, which is lattice formed, is formed using a mask pattern 320 having a lattice form corresponding to the isolation pattern (250 of FIG. 3).

A sacrificial film 310 may be used as a sacrificial layer for applying a double patterning technique DPT. The sacrificial film 310 may be formed using, for example, a spin coating process and a baking process. For example, the sacrificial film 310 may include may include polysilicon, spin on hard mask (SOH), or spin on glass (SOG). In order to use the mask pattern 320 as an etching mask during a patterning process of the sacrificial film 310, the mask pattern 320 may be formed of a material having a difference of etching selectivity from the sacrificial film 310. For example, the mask pattern 320 disposed on the sacrificial film 310 may include an antireflective layer ARC such as a silicon oxynitride or a silicon nitride, and may further include a bottom antireflective coating BARC on the antireflective layer.

Referring to FIG. 8A, while a first pattern structure PS1 having a first width d is formed in the pixel array region SA using the mask pattern 320, a second pattern structure PS2 having a second width D, greater than the first width d, may be formed in the peripheral region. The first width d of the first pattern structure PS1 may be set in consideration of the width of the isolation pattern (250 of FIG. 3), and the second width D may be set in consideration of the width of the peripheral region PA. During an etching process for obtaining the first and second pattern structures PS1 and PS2, the mask pattern 320 of the first pattern structure PS1 may be etched further than the mask pattern 320 of the second pattern structure PS2 due to a three-dimensional etching effect (indicated by arrows). Therefore, a height L0 of the second pattern structure PS2 may be greater than a height L1 of the first pattern structure PS1.

Subsequently, spacers 330S may be formed on both sides of the first and second pattern structures.

Figure 7B:
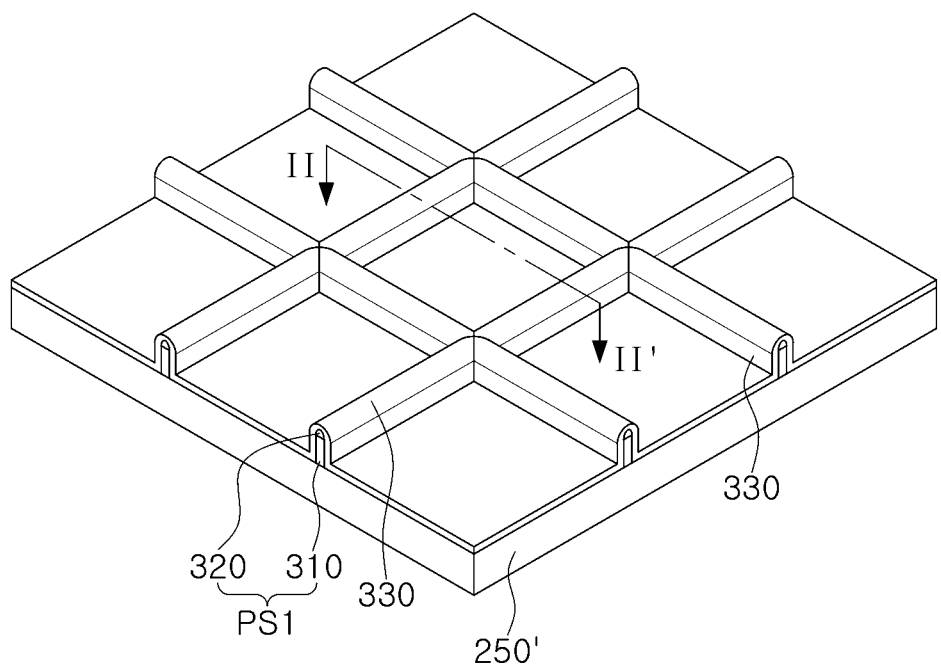
Figure 8B:
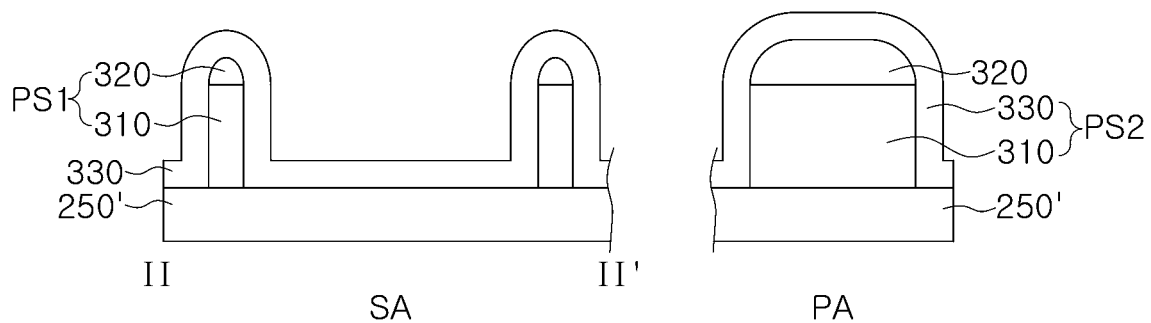

Referring to FIGS. 7B and 8B, a spacer film 330 may be conformally formed on the insulating layer 250'. Specifically, the spacer film 330 may be conformally formed to cover not only an upper surface of the insulating layer 250' but also both side surfaces and upper surfaces of the first and second pattern structures. The spacer film 330 may be formed to have a thin thickness (e.g., 30 nm or less) using, for example, an atomic layer deposition (ALD) process. For example, the spacer film 330 may include silicon oxynitride or silicon nitride.

Figure 7C:
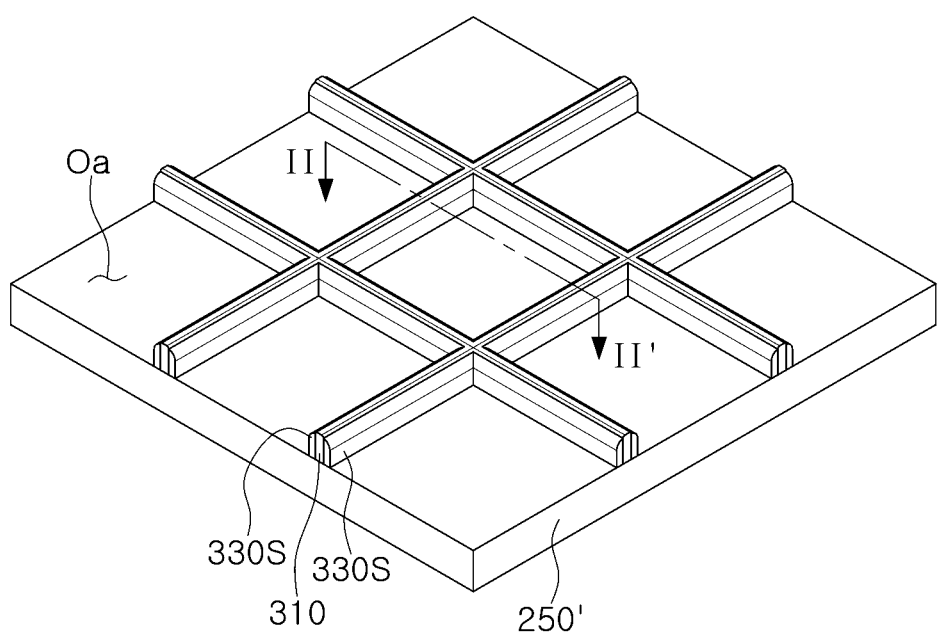
Figure 8C:
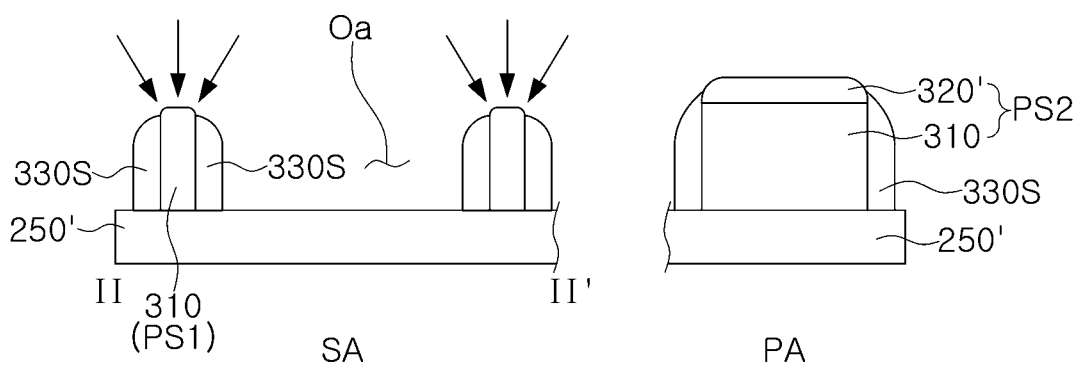

Referring to FIGS. 7C and 8C, the spacer film (see 300 of FIGS. 7B and 8B) may be etched-back to form a spacer 330S on both sides of the first and second pattern structures PS1 and PS2. As illustrated in FIG. 8C, in the pixel array region SA, the spacer film 330 between an upper end of the first pattern structure PS1 and the first pattern structure PS1 may be removed during an etch-back process of the spacer film 330. Accordingly, first openings Oa through which the insulating layer 250' is exposed may be formed in a region corresponding to a first transparent electrode (280 of FIG. 3). In the peripheral region PA, only the spacer film 330 disposed on an upper end of the second pattern structure PS2 is removed, but in the pixel region PA, not only the spacer film 330 positioned on the upper end of the first pattern structure PS1 but also the mask pattern 320 may be removed by a 3D etching effect, and the sacrificial film 310 may be exposed between the spacers 330S.

Figure 7D:
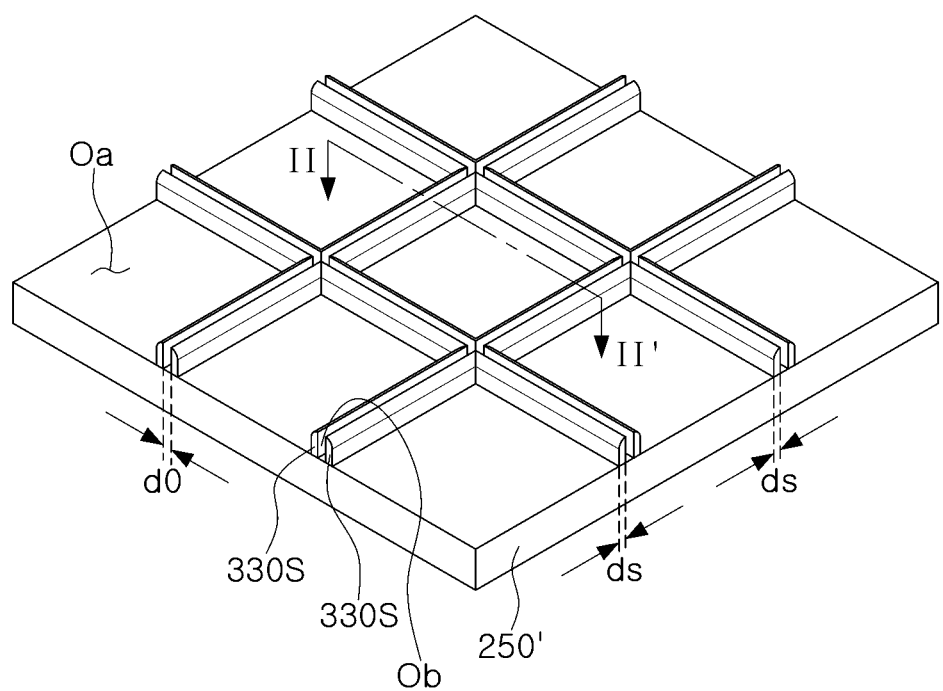
Figure 8D:
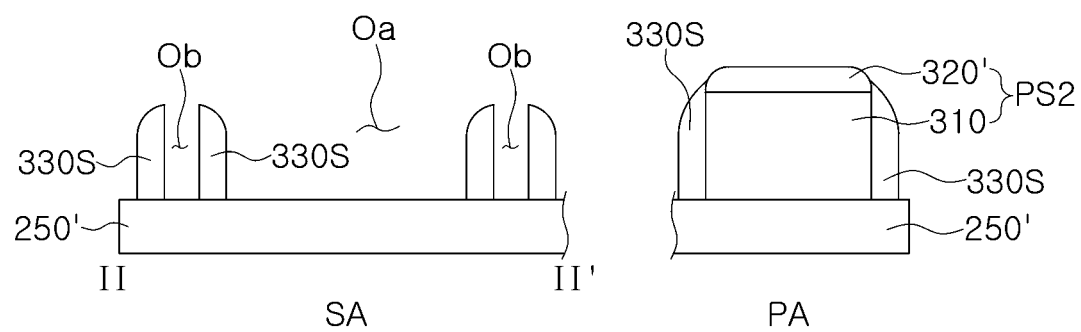

Referring to FIGS. 7D and 8D, a sacrificial film (see 310 of FIGS. 7C and 8C) positioned in the pixel array region SA may be removed.

Specifically, a sacrificial film 310 positioned in the pixel array region SA may be removed using an ashing process or a cleaning process. When the sacrificial film 310 is removed, a pair of spacers 330S adjacent to the insulating layer 250' positioned on the isolation region (SR of FIG. 4) may be positioned. A second opening Ob for a trench T may be provided in a space between the adjacent spacers 330S. In a plan view (see FIG. 7D), the second opening Ob may have a lattice form having a constant width corresponding to the lattice form of the spacer 330S.

The spacer 330S positioned in the pixel array region SA may be used as an etching mask for forming the isolation pattern (250 of FIG. 3). Specifically, an interval (do) of a pair of spacers 330S may define the width of the drain electrode (270D of FIG. 3), and a width (ds) of each spacer 330S may define the width (WS of FIG. 5) of both sidewall portions of the drain electrode (270D of FIG. 3) in the isolation pattern (250 of FIG. 3). On the other hand, as illustrated in FIG. 8D, in the peripheral region PA, since the second pattern structure PS2 remains without being etched by the mask pattern 320 positioned at the upper end thereof, the sacrificial film 310 of the second pattern structure PS2 may not be removed. Therefore, the second pattern structure PS2 including the spacer 330S may serve as an etching mask for the peripheral region PA.

Figure 7E:
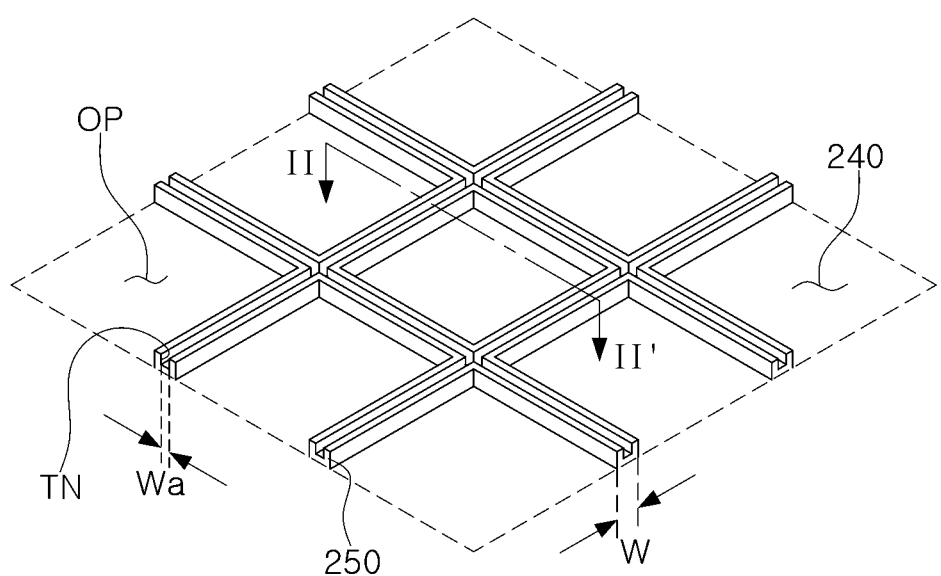
Figure 8E:
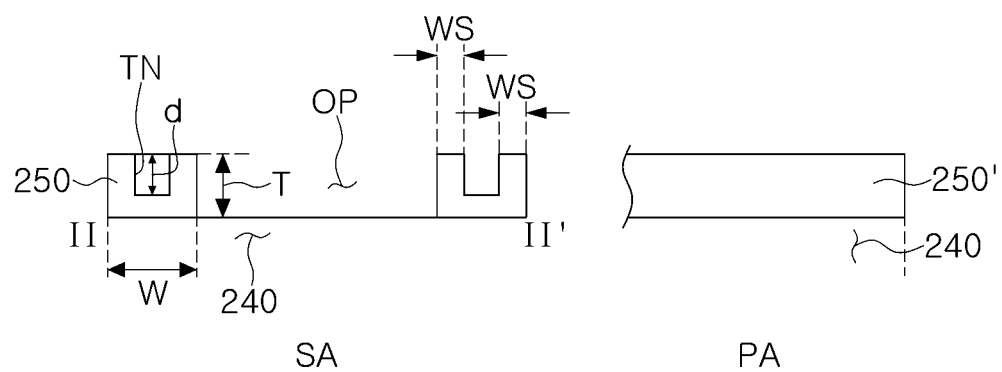

Next, referring to FIGS. 7E and 8E, an isolation pattern 250 is formed by selectively etching the insulating layer 250' using the above-described results as an etching mask.

The isolation pattern 250 may have openings OP for the first transparent electrode (270 of FIG. 3) and a trench T for the drain electrode (270D of FIG. 3). While the openings OP are etched by the first openings (Oa of FIG. 7D) to penetrate the insulating layer (250' of FIG. 7D), since the second opening OP (Oa of FIG. 7D) has a relatively narrow width, smooth etching cannot be performed. Therefore, it may be formed as a trench TN that does not completely penetrate the insulating layer 250' of FIG. 7D. An insulating portion may remain in a bottom portion of the trench TN.

As illustrated in FIG. 8E, a depth (t) of the trench TN may be smaller than each depth (T) of the openings OP, and respective thicknesses (T) of the openings OP may be substantially the same as the thickness of the isolation pattern 250. In some example embodiments, the width W of the isolation pattern 250 may be 100 nm or less. Sidewall portions positioned on both sides of the trench TN in the isolation pattern 250 may have substantially the same with WS. For example, each width WS of both sidewall portions of the isolation pattern 270D may be in a range of 5 nm to 30 nm. For example, a width Wd of the trench may be range from between about 10 nm to about 90 nm. However, the width is not limited thereto, and may be changed according to process conditions such as a photolithography facility, or the like.

With the foregoing in mind and referring to FIG. 6C, a plurality of first transparent electrodes 270 and the drain electrode 270D may be formed using the isolation pattern 250 having the plurality of openings OP and the trench T.

Here, the plurality of first transparent electrodes 270 and the drain electrode 270D may be formed by a damascene process. After depositing an electrode material 270' on the cover insulating layer 240 exposed to the isolation pattern 250 and the openings OP, a plurality of first transparent electrodes 270 and the drain electrode 270D may be formed in the plurality of openings OP and the trench T, respectively, by applying an etch-back or a grinding process. In this case, upper surfaces of the plurality of first transparent electrodes 270 may have surfaces that are substantially coplanar with the upper surfaces of the isolation pattern 250 and the drain electrode 270D, respectively.

In certain image sensors consistent with an embodiment of the inventive concept (e.g., the image sensor of FIGS. 3 and 4), a hybrid structure is provided in which a semiconductor photoelectric converting element (e.g., photodiode 140) and an organic photoelectric converting element (e.g., organic photoelectric layer 280) are coupled. However, image sensors according to embodiments of the inventive concept need not include only an organic photoelectric converting element.

Figure 9:
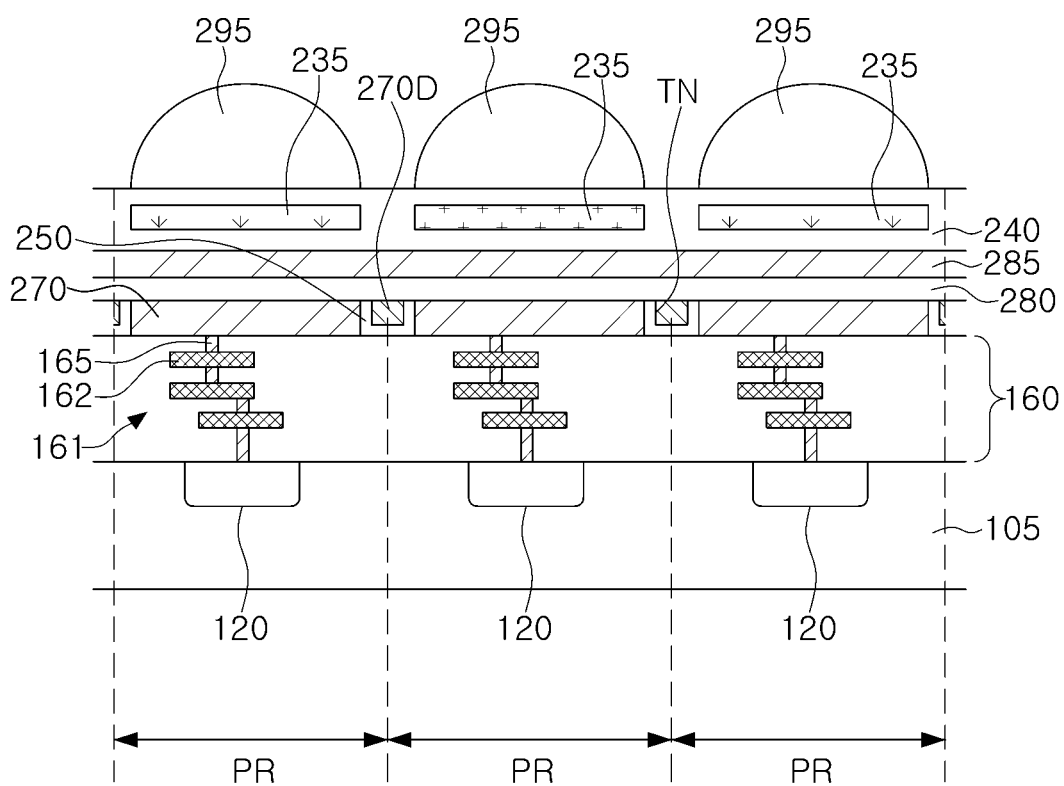
FIG. 9 is a cross-sectional view illustrating an image sensor according to an example embodiment of the inventive concept.

FIG. 9 is a cross-sectional view illustrating an image sensor 1000B according to an example embodiment of the inventive concept.

Referring to FIG. 9, the image sensor 1000B may include a semiconductor substrate 105 including a plurality of pixel regions PR, a wiring structure 160 disposed on the semiconductor substrate 105 and having wiring circuits 162 and 165, and an organic photoelectric converting element disposed to correspond to the plurality of pixel regions PR. Descriptions of the same or similar components of the image sensor illustrated in FIGS. 3 and 4 may be combined with descriptions of the same or similar components of the image sensor according to the example embodiment, unless specifically stated otherwise herein.

The organic photoelectric converting element employed in the example embodiment of FIG. 9 may include a plurality of first transparent electrodes 270 disposed to correspond to the plurality of pixel regions PR, respectively, an organic photoelectric layer 280 sequentially disposed on the plurality of first transparent electrodes 270, and a second transparent electrode 285. The organic photoelectric layer 280 and the second transparent electrode 285 may be integrally formed over the plurality of pixel regions PR.

An image reading circuit 120 including a transistor may be implemented on the upper surface of the semiconductor substrate 105, and may be connected to the organic photoelectric converting element through the wiring circuits 162 and 165 of the wiring structure 160, respectively. Specifically, the first transparent electrode 270 may be connected to a wiring circuit (e.g., metal via 165) of the wiring structure 160. A plurality of color filters 235 may be disposed on positions corresponding to the plurality of pixel regions PR on the second transparent electrode 285. The plurality of color filters 235 may be covered by the cover insulating layer 240. The plurality of color filters 235 may include red, green, and blue color filters, respectively.

The plurality of first transparent electrodes 270 may be separated by the isolation pattern 250. The isolation pattern 250 employed in the example embodiment may have a lattice structure similar to the isolation pattern 250 illustrated in FIG. 3. The isolation pattern 250 may have a trench TN in a position spaced apart from the plurality of first transparent electrodes 270, and a drain electrode 270D disposed in the trench TN of the isolation pattern 250 may be disposed. The drain electrode 270D may have a lattice structure similar to an arrangement structure of the isolation pattern 250. The upper surfaces of the plurality of first transparent electrodes 270 may be substantially coplanar with the upper surfaces of the isolation pattern 250 and the upper surfaces of the drain electrode 270D.

As illustrated in FIG. 3, the drain electrode 270D may receive an externally provided drain voltage through the second through structure 220D and the wiring circuits 162 and 165. In the drain electrode 270D, when a potential higher than a potential of the first transparent electrode 270 is applied, holes (or electrons) may be moved to the adjacent first transparent electrode 270 on both sides in a region of the organic photoelectric layer 280 positioned above the drain electrode 270D to prevent mutual interference between pixels and increase quantum efficiency.

The drain electrode 270D may have a thickness less than respective thicknesses of the plurality of first transparent electrodes 270. Respective thicknesses of the plurality of first transparent electrodes 270 may be substantially the same as the thickness of the isolation pattern 250.

Since the isolation pattern 250 may be formed using a DPT, the isolation pattern may be formed in a considerably thinner (less wide) space. For example, the isolation pattern 250 may have a width of 100 nm or less. In addition, portions positioned on both sides of the drain electrode 270D in the isolation pattern 250 may have substantially the same widths. For example, the respective width of isolation pattern 250 portions positioned on opposing sides of the drain electrode 270D may range from between about 5 nm to about 30 nm.

Figure 10:
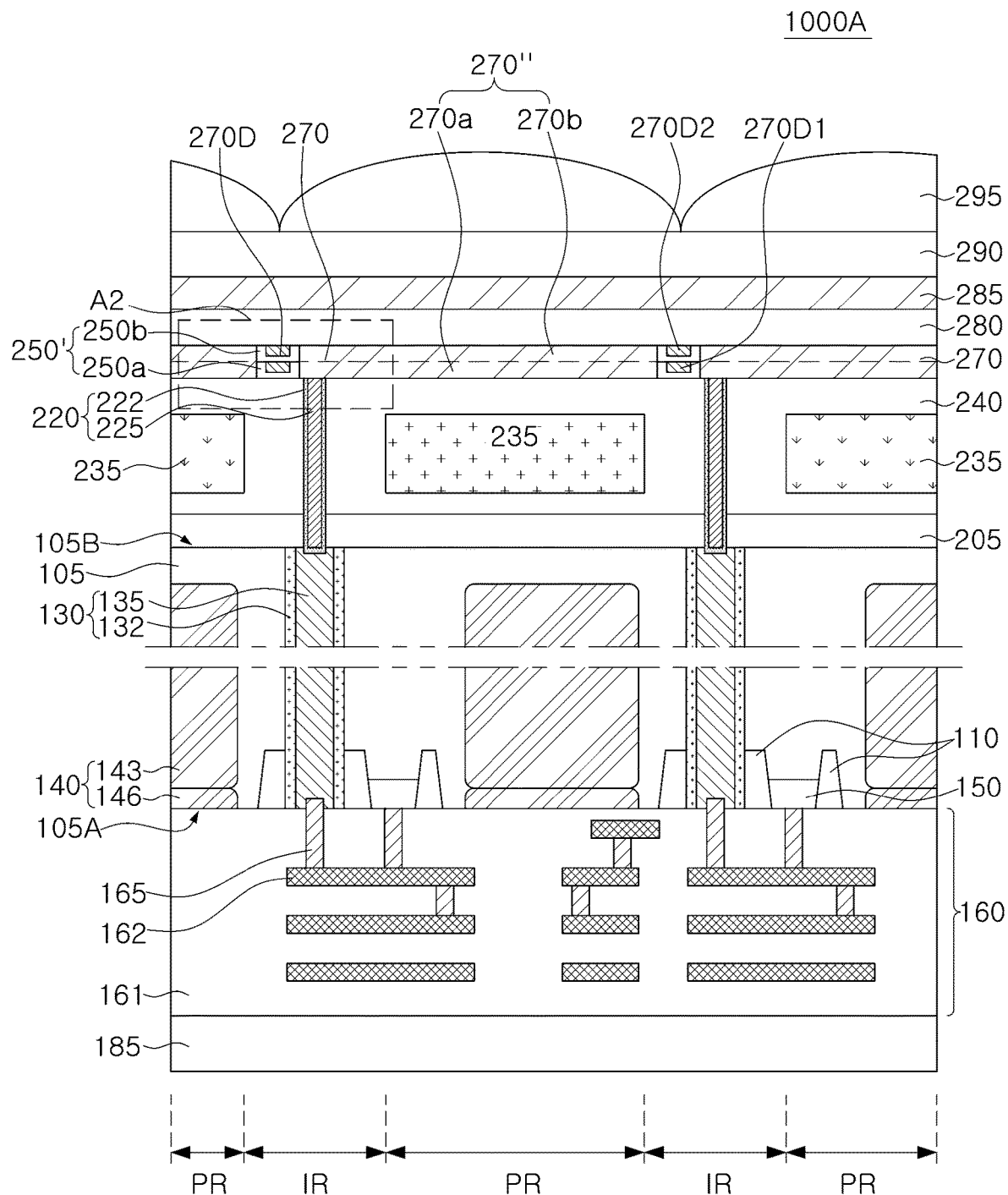
FIG. 10 is a cross-sectional view illustrating an image sensor according to an example embodiment of the inventive concept.
Figure 11:
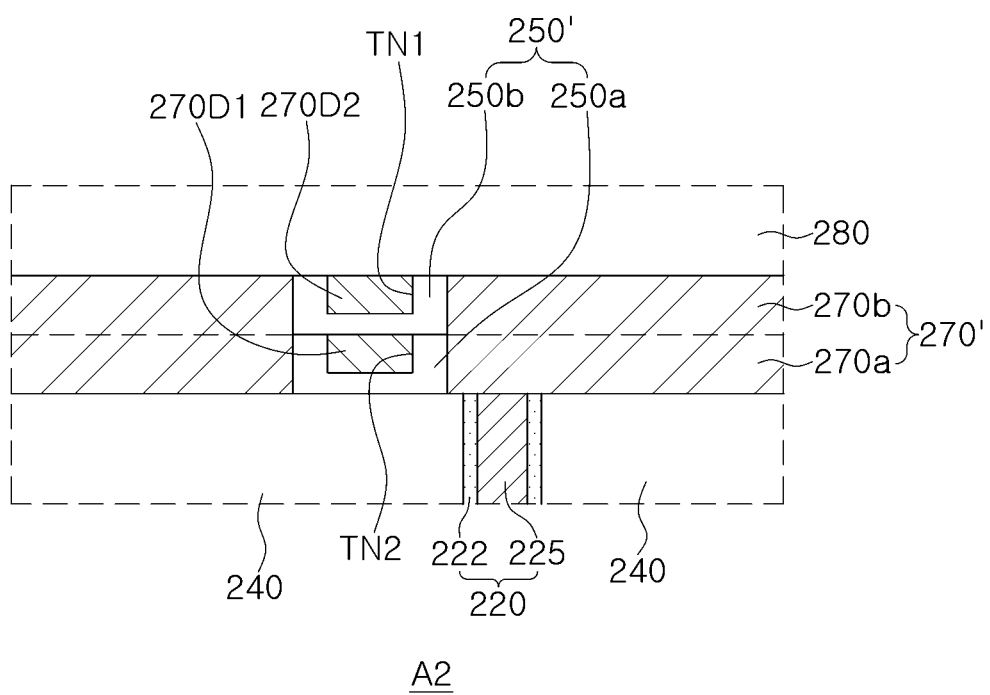
FIG. 11 is an enlarged view illustrating portion "A2" of the image sensor of FIG. 10.

Referring to FIGS. 10 and 11, another image sensor 1000C according to the example embodiment of the inventive concept is presented and has a structure substantially similar to that of the image sensor 1000A of FIGS. 3 and 4, except that an isolation pattern 250' includes two isolation patterns 250a and 250b, a first transparent electrode 270' includes a lower electrode and an upper electrode, and accordingly, includes first and second electrode lines 270D1 and 270D2 that are electrically separated.

Hence, the image sensor 1000C includes an isolation pattern 250' having a multilayer structure and a first transparent electrode 270'. The isolation pattern 250' includes first and second isolation patterns 250a and 250b sequentially disposed on the cover insulating layer 240. Similar to the isolation pattern 250 illustrated in FIG. 3, the first and second isolation patterns 250a and 250b may have a lattice structure in which regions corresponding to the plurality of pixel regions PR are opened. In addition, the first and second isolation patterns 250a and 250b may include first and second trenches TN1 and TN2 arranged in a lattice structure from a planar view, respectively.

The plurality of first transparent electrodes 270' may have a lower electrode layer 270a isolated by the first isolation pattern 250a and an upper electrode layer 270b disposed on the lower electrode layer 270a and separated by the second isolation pattern 250b. The lower electrode layer 270a and the upper electrode layer 270b, which are stacked, may constitute a first transparent electrode 270 for one pixel region PR.

A first electrode line 270D1 may be disposed in a first trench TN1 of the first isolation pattern 250a, and a second electrode line 270D2 may be disposed in a second trench TN2 of the second isolation pattern 250b. The first and second electrode lines 270D1 and 270D2 may have a lattice structure disposed between the plurality of first transparent electrodes 270, similarly to the drain electrode 270D illustrated in FIG. 3 in a planar view.

In the example embodiment illustrated in FIGS. 10 and 11, a second electrode line 270D2 separated from the first electrode line 270D1 by the second isolation pattern 250b may constitute an independent circuit line. For example, the second electrode line 270D2 positioned directly below the organic photoelectric layer 280 may be configured to have the drain electrode function described above, and the first electrode line 270D1 may be configured to have another function, for example, which is used as an electrode for reducing a power shading effect. In some example embodiments, the second electrode line 270D2 may be connected to the wiring circuits 162 and 165 in the peripheral region (PA of FIG. 2) to be configured to receive a drain voltage from an outside, or the first electrode line 270D1 may be connected to the wiring circuits 162 and 165 in the peripheral region (PA of FIG. 2) to be configured to receive a pixel voltage or be grounded from an outside. In the example embodiment illustrated in FIGS. 10 and 11, unlike the formerly described example embodiments, not only the first transparent electrode 270, but also the first and second electrode lines 270D1 and 270D2 may not use a separate through structure, but may simply be connected through the wiring circuit (e.g., metal via 165) of the wiring structure 160.

Image sensors according to the certain example embodiment may be implemented by variously changing some configurations. For example, the first transparent electrode 270 of the image sensor 1000B illustrated in FIG. 9 may not necessarily consist of a transparent electrode material, since the semiconductor photoelectric converting elements (e.g., photodiodes 140) are not disposed below.

Meanwhile, in the image sensor 1000C illustrated in FIGS. 10 and 11, although the bottom portion of the second trench TN2 of the second isolation pattern 250b is required to be retained for insulation of the first and second electrode lines 270D1 and 270D2, the cover insulating layer 140 may be positioned below the first isolation pattern 250a, such that the first trench TN1 may also be formed by completely penetrating the first isolation pattern 250a.

As set forth above, by providing a drain electrode positioned under an organic photoelectric layer in a relatively narrow space using a DPT process, it is possible to maintain high quantum efficiency while greatly reducing crosstalk between pixels.

The various advantages and useful aspects of the inventive concept are not limited to only the above description, and may be more easily understood in the course of describing a specific embodiment of the inventive concept.

While example embodiments have been shown and described above, it will be apparent to those skilled in the art that modifications and variations could be made without departing from the scope of the inventive concept as defined by the appended claims.

What is claimed is:

1. An image sensor, comprising:
   a semiconductor substrate including a plurality of pixel regions separated by an isolation region and having a first surface and an opposing second surface, wherein the second surface receives incident light;
   a plurality of color filters respectively disposed on the second surface of the semiconductor substrate to correspond to the plurality of pixel regions;
   a cover insulating layer disposed on the second surface of the semiconductor substrate and covering the plurality of color filters;
   a plurality of first transparent electrodes disposed on the cover insulating layer and spaced apart to respectively overlap the plurality of color filters;
   an isolation pattern disposed on the cover insulating layer between the plurality of first transparent electrodes and having a trench spaced apart from the plurality of first transparent electrodes;
   a drain electrode disposed in the trench of the isolation pattern; and
   an organic photoelectric layer and a second transparent electrode sequentially disposed on the plurality of first transparent electrodes and the isolation pattern.

2. The image sensor of claim 1, wherein the drain electrode has a thickness less than respective thicknesses of the plurality of first transparent electrodes.

3. The image sensor of claim 2, wherein the respective thicknesses of the plurality of first transparent electrodes are substantially the same as the thickness of the isolation pattern.

4. The image sensor of claim 2, wherein upper surfaces of the plurality of first transparent electrodes are substantially coplanar with upper surfaces of the isolation pattern and upper surfaces of the drain electrode.

5. The image sensor of claim 1, wherein the isolation pattern has a width less than about 100 nm.

6. The image sensor of claim 1, wherein portions of the isolation pattern adjacent to the drain electrode have substantially the same width.

7. The image sensor of claim 6, wherein the same width ranges from about 5 nm to about 30 nm.

8. The image sensor of claim 1, wherein a thickness of a bottom portion of the trench in the isolation pattern is at least 5% of the thickness of the isolation pattern.

9. The image sensor of claim 1, wherein the plurality of first transparent electrodes and the drain electrode include the same transparent electrode material.

10. The image sensor of claim 1, further comprising a wiring structure disposed on the first surface of the semiconductor substrate and including a wiring circuit.

11. The image sensor of claim 10, further comprising a plurality of through electrode structures penetrating the isolation region, and electrically connecting the plurality of first transparent electrodes and the plurality of pixel regions through the wiring circuit.

12. The image sensor of claim 10, further comprising at least one through electrode structure penetrating the isolation region, and electrically connecting the drain electrode to the wiring circuit.

13. The image sensor of claim 12, wherein the isolation region is disposed in a peripheral region surrounding the plurality of pixel regions, and the at least one through structure penetrates the peripheral region.

* * * * *